United States Patent
Mohr et al.

(10) Patent No.: US 11,495,577 B2
(45) Date of Patent: Nov. 8, 2022

(54) SEMICONDUCTOR DEVICES HAVING THROUGH-STACK INTERCONNECTS FOR FACILITATING CONNECTIVITY TESTING

(71) Applicant: Micron Technology, Inc., Boise, ID (US)

(72) Inventors: Christian N. Mohr, Allen, TX (US); Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 16/894,568

(22) Filed: Jun. 5, 2020

(65) Prior Publication Data

US 2020/0303349 A1 Sep. 24, 2020

Related U.S. Application Data

(62) Division of application No. 16/020,140, filed on Jun. 27, 2018, now Pat. No. 10,692,841.

(51) Int. Cl.
*H01L 25/065* (2006.01)
*G01R 27/14* (2006.01)
*H01L 23/538* (2006.01)

(52) U.S. Cl.
CPC .......... *H01L 25/0657* (2013.01); *G01R 27/14* (2013.01); *H01L 23/5385* (2013.01)

(58) Field of Classification Search
CPC ............. H01L 22/14; H01L 22/34; H01L 2224/16145; H01L 2224/16148; H01L 2225/06513; H01L 2225/06548; H01L 23/5385; H01L 25/0657

See application file for complete search history.

(56) References Cited

U.S. PATENT DOCUMENTS

| | | | |
|---|---|---|---|
| 2011/0309359 A1 | 12/2011 | Saen et al. | |
| 2013/0076387 A1* | 3/2013 | Ishikawa | G11C 29/025 257/774 |
| 2015/0123132 A1* | 5/2015 | Yoon | H01L 23/481 257/48 |
| 2020/0006291 A1 | 1/2020 | Mohr et al. | |

\* cited by examiner

*Primary Examiner* — Meiya Li
(74) *Attorney, Agent, or Firm* — Perkins Coie LLP (57) ABSTRACT

Semiconductor devices having through-stack interconnects for facilitating connectivity testing, and associated systems and methods, are disclosed herein. In one embodiment, a semiconductor device includes a stack of semiconductor dies and a plurality of through-stack interconnects extending through the stack to electrically couple the semiconductor dies. The interconnects include functional interconnects and at least one test interconnect. The test interconnect is positioned in a portion of the stack more prone to connectivity defects than the functional interconnects. Accordingly, testing the connectivity of the test interconnect can provide an indication of the connectivity of the functional interconnects.

18 Claims, 6 Drawing Sheets

| | SIGNAL_P | SIGNAL_N₁ | SIGNAL_N₂ | SIGNAL_N₃ | LOGIC_OUT |
|---|---|---|---|---|---|
| Test 102a–102b Connectivity (Block 332) | On | On | Off | Off | 0 |
| Test 102a–102c Connectivity (Block 334) | On | Off | On | Off | 0 |
| Test 102a–102d Connectivity (Block 336) | On | Off | Off | On | 1 |

SEMICONDUCTOR DEVICES HAVING THROUGH-STACK INTERCONNECTS FOR FACILITATING CONNECTIVITY TESTING

CROSS-REFERENCE TO RELATED APPLICATION(S)

This application is a division of U.S. application Ser. No. 16/020,140, filed Jun. 27, 2018, and titled "SEMICONDUCTOR DEVICES HAVING THROUGH-STACK INTERCONNECTS FOR FACILITATING CONNECTIVITY TESTING," which is incorporated herein by reference in its entirety.

TECHNICAL FIELD

The present disclosure generally relates to semiconductor devices having through-stack interconnects, and more particularly relates to semiconductor devices having dedicated through-stack interconnects extending through areas prone to warpage for facilitating connectivity testing.

BACKGROUND

Packaged semiconductor dies, including memory chips, microprocessor chips, and imager chips, typically include one or more semiconductor dies mounted on a substrate and encased in a protective covering. The semiconductor dies include functional features, such as memory cells, processor circuits, and imager devices, as well as bond pads electrically connected to the functional features. The bond pads can be electrically connected to terminals outside the protective covering to allow the semiconductor die to be connected to higher level circuitry. Within some packages, semiconductor dies can be stacked upon and electrically connected to one another by individual interconnects placed between adjacent semiconductor dies. In such packages, each interconnect can include a conductive material (e.g., solder) and a pair of contacts on opposing surfaces of adjacent semiconductor dies. For example, a metal solder can be placed between the contacts and reflowed to form a conductive joint.

One challenge with such traditional packages is that variations in heat and/or force can exist during a bonding operation to form the interconnects. This can affect the quality of the interconnects, for example, by leading to an open-circuit across the solder joints, high ohmic resistance across the solder joints, solder bridging between nearby interconnects, etc.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor devices having dedicated through-stack interconnects for testing the connectivity of other, functional through-stack interconnects, and associated systems and methods, are described below. In several of the embodiments described below, a method for testing the connectivity of through-stack interconnects extending through a stack of semiconductor dies includes (i) determining the connectivity of a test through-stack interconnect extending through a first portion of the stack and, (ii) based on the determined connectivity of the test through-stack interconnect, determining the connectivity of a plurality of functional through-stack interconnects extending through a second portion of the stack. In some embodiments, the second portion of the stack is less prone to connectivity defects than the first portion of the stack. For example, the first portion of the stack can be a laterally outboard portion of the stack that is adjacent to one or more edges of the stack, and that is more susceptible to bending or warpage during a bonding operation used to form the through-stack interconnects. Accordingly, it can be determined that the functional through-stack interconnects are likely connected if the test through-stack interconnect—positioned in a more high-risk region of the stack—is determined to be connected. Thus, the present technology can advantageously facilitate connectivity testing of the through-stack interconnects in a semiconductor device without requiring that each interconnect be tested individually.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Unless the context indicates otherwise, structures disclosed herein can be formed using conventional semiconductor-manufacturing techniques, and stages of the methods used to form the structures can be performed at the wafer level or at the die level. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-7.

Figure 1:
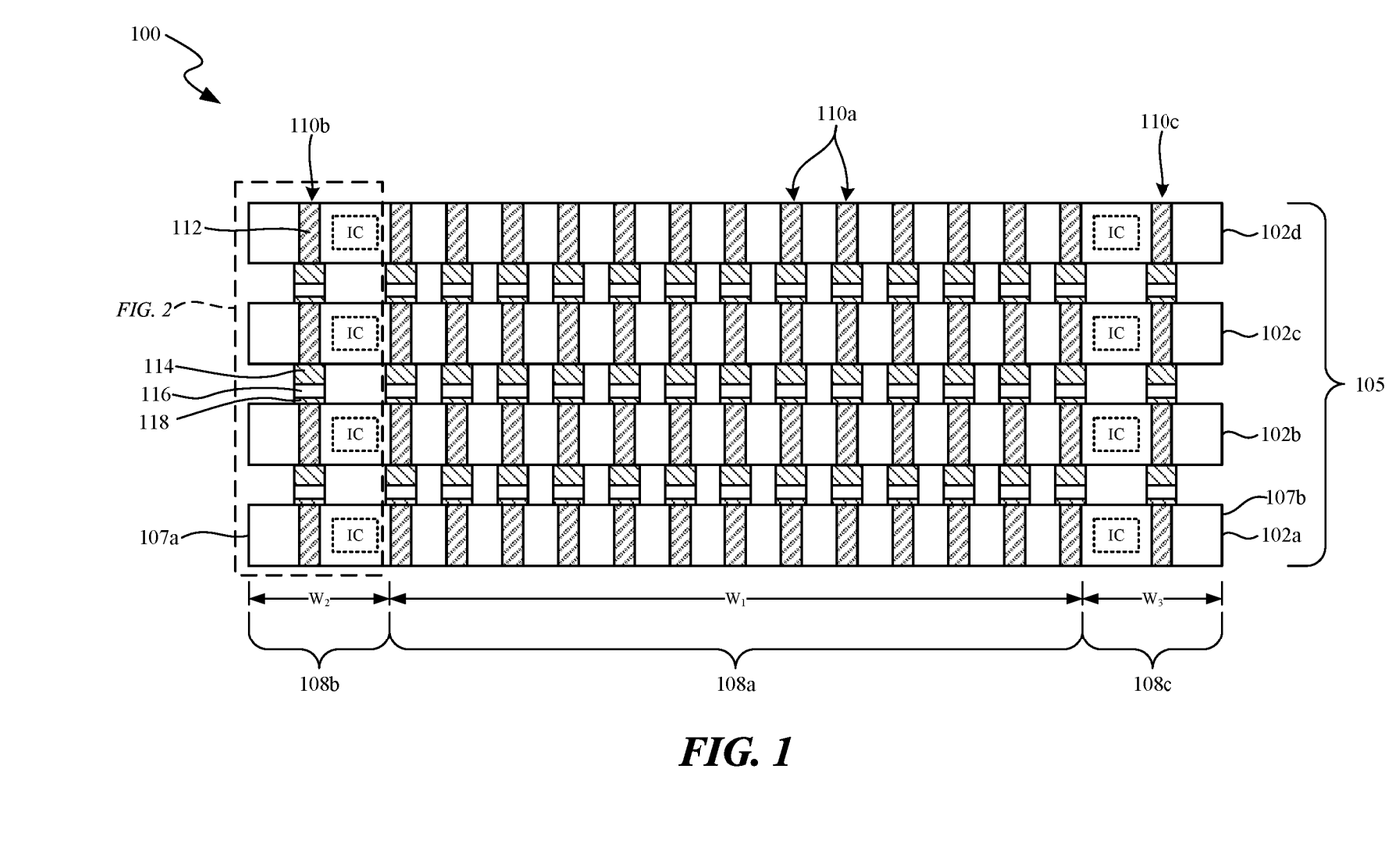
FIG. 1 is a side cross-sectional view of a semiconductor device in accordance with an embodiment of the present technology.

FIG. 1 is a side cross-sectional view of a semiconductor device 100 ("device 100") configured in accordance with an embodiment of the present technology. The device 100 includes a plurality of semiconductor dies 102 (individually labeled as first through fourth semiconductor dies 102a-d) arranged in a stack 105. Each of the semiconductor dies 102 can have integrated circuitry IC including one or more of, for example, a memory circuit (e.g., a dynamic random memory (DRAM)), a controller circuit (e.g., a DRAM controller), a logic circuit, a detection circuit (as described in greater detail below with reference to FIG. 2), and/or other circuits. In some embodiments, each of the semiconductor dies 102 can include similar components and/or have similar configurations. For example, the semiconductor dies 102 can be identical (e.g., including identical components). In certain embodiments, one or more of the semiconductor dies 102 can be configured as a master and the other semiconductor dies 102 can be configured as slaves of the master. In some embodiments, the stack 105 can include more or fewer than the illustrated four semiconductor dies 102 (e.g., two semiconductor dies, three semiconductor dies, or five or more semiconductor dies).

The device 100 also includes a plurality of through-stack interconnects 110 ("interconnects 110") extending generally vertically through the stack 105 and electrically coupling the semiconductor dies 102. More particularly, the device 100 includes an array of individual first through-stack interconnects 110a ("first interconnects 110a") that extend through a first portion 108a of the stack 105, a second through-stack interconnect 110b that extends through a second portion 108b of the stack 105, and a third through-stack interconnect 110c that extends through a third portion 108c of the stack 105. Each of the interconnects 110 can be composed of a combination of vertically and/or laterally arranged conductive elements interconnected to one another throughout the stack 105 of semiconductor dies 102. For example, each of the interconnects 110 can include an arrangement of interconnected through-die vias 112, conductive pillars 114, solder bumps 116, conductive pads 118, and/or other suitable conductive elements such as metal traces, etc. The interconnects 110 can be formed by a suitable bonding operation, or other process as is well known in the art.

The first interconnects 110a can be functional through-stack interconnects (e.g., signal lines and power lines) that are used during operation of the device 100. In some embodiments, the device 100 can include a smaller or greater number of first interconnects 110a than shown in FIG. 1. For example, the device 100 can include tens, hundreds, thousands, or more first interconnects 110a extending through the stack 105 of semiconductor dies 102. As described in detail below with reference to FIGS. 2-5, the interconnects 110b, c can be test interconnects configured for use during a connectivity test to determine the connectivity of the first interconnects 110a. Accordingly, the interconnects 110b, c can be referred to herein as test interconnects 110b, c. In other embodiments, more than test interconnect 110b can be formed in the second portion 108b of the stack 105, more than one test interconnect 110c can be formed in the third portion 108c of the stack 105, and/or the device 100 could include only the test interconnect(s) 110b or the test interconnect(s) 110c.

The portions 108b, c of the stack 105 can be portions of the stack 105 in which interconnects formed therein are more prone to connectivity defects than identical interconnects formed in the first portion 108a of the stack. That is, the test interconnects 110b, c are positioned in a region of the stack 105 such that they are more likely to be electrically disconnected or otherwise compromised from errors or variations in the bonding operation used to form the interconnects 110. In the illustrated embodiment, for example, the portions 108b, c are positioned laterally outboard of the first portion 108a and adjacent to opposing first and second edges 107a, b, respectively, of the stack 105. As such, the portions 108b, c can be more prone to warpage (e.g., bending, deformation, etc.) during the bonding operation used to form the interconnects 110, which can damage interconnects formed therein. In some embodiments, the first portion 108a can have a width $W_1$ of between about 5000-1000 µm (e.g., about 6000 µm, about 9000 µm, etc.) and the portions 108b, c can have widths $W_2$ and $W_3$, respectively, of between about 50-250 µm (e.g., about 200 µm). In some embodiments, the test interconnects 110b, c can be formed a distance of between about 50-150 µm (e.g., about 100 µm) from the edges 107a, b, respectively, of the stack 105. Accordingly, in some embodiments, the test interconnects 110b, c can be positioned nearer to an edge of the stack 105 than any one of the first interconnects 110a.

In general, because the test interconnects 110b, c are formed in a portion of the stack 105 that is more prone to damage during the bonding operation used to form the interconnects 110 (e.g., closer to a lateral edge of the stack, closer to a corner of the stack, closer to an aperture through the stack, etc.), a determined connectivity of the test interconnects 110b, c can serve as an indication of (e.g., proxy for) the connectivity of the first interconnects 110a. That is, if the test interconnects 110b, c are electrically connected, the first interconnects 110a—positioned in a less defect prone portion of the stack 105—are likely connected as well. Conversely, if the test interconnects 110b, c are electrically disconnected, it is more likely that at least one of the first interconnects 110a is also electrically disconnected.

In some embodiments, the device 100 can further include other structures or features such as, for example: (i) a casing (e.g., a thermally conductive casing that encloses the semiconductor dies 102 within an enclosure), (ii) an underfill material deposited or otherwise formed around and/or between the semiconductor dies 102, and/or (iii) a support substrate (e.g., an interposer and/or a printed circuit board configured to operably couple the semiconductor dies 102 to external circuitry).

Figure 2:
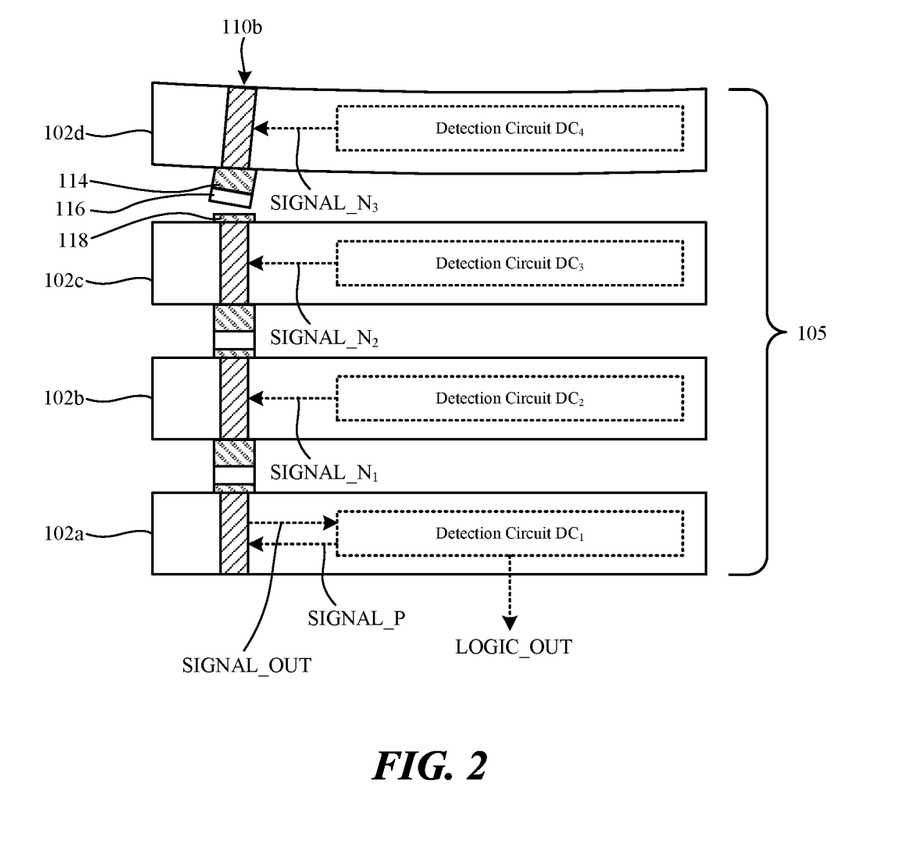
FIG. 2 is a partially schematic, enlarged side cross-sectional view of a test interconnect of the semiconductor device of FIG. 1 configured in accordance with an embodiment of the present technology.

FIG. 2 is a partially schematic, enlarged side cross-sectional view of the test interconnect 110b of the device 100 configured in accordance with an embodiment of the present technology. In the illustrated embodiment, the fourth semiconductor die 102d is shown warped relative to the third semiconductor die 102c to illustrate various aspects of the present technology. The warpage could be the result of, for example, variations in heat and/or force during the bonding operation used to from the interconnects 110, and can cause a connectivity defect in the test interconnect 110b such as the illustrated electrical disconnection (e.g., open circuit) between the solder bump 116 on the conductive pillar 114 of the fourth semiconductor die 102d, and the conductive pad 118 on the third semiconductor die 102c. In some instances, the connectivity defect can be a partial electrical disconnection (e.g., a highly resistive connection) or other type of connectivity defect. In general, one or more of the semiconductor dies 102 could be warped and/or one or more connectivity defects could exist along the interconnect 110b.

In the illustrated embodiment, the integrated circuitry IC (FIG. 1) of each of the semiconductor dies 102a-d includes a detection circuit $DC_1$-$DC_4$, respectively. The detection circuits $DC_1$-$DC_4$ are electrically coupled to the test interconnect 110b (and/or the test interconnect 110c). In some embodiments, the detection circuits $DC_1$-$DC_4$ are not electrically coupled to the first interconnects 110a. In general, the detection circuits $DC_1$-$DC_4$ can be configured to (i) output a signal to the test interconnect 110b, (ii) detect a signal carried by the test interconnect 110b, and/or (iii) output a logic signal indicative of a resistance (e.g., connectivity) of the test interconnect 110b. More particularly, in some embodiments, the first semiconductor die 102a can be configured as a master while the semiconductor dies 102b-d can be configured as slaves of the first, master semiconductor die 102a. In such embodiments, the detection circuit $DC_1$ of the first semiconductor die 102a can include a signal source (e.g., a p-channel) configured to output a signal SIGNAL_P to the test interconnect 110b. The detection circuit $DC_1$ can also receive a signal SIGNAL_OUT from the test interconnect 110b (e.g., a resultant voltage of the test interconnect 110b), and output (e.g., to an output buffer or data terminal of the device 100) a logic signal LOGIC_OUT based on the received signal SIGNAL_OUT.

The detection circuits $DC_2$-$DC_4$ of the slave semiconductor dies 102b-d can each include signal sources (e.g., n-channels) configured to output signals SIGNAL_$N_1$-$N_3$, respectively, to the test interconnect 110b. In some embodiments, the signals SIGNAL_$N_1$-$N_3$ are n-channel pulldown signals having a n-ch drive strength (e.g., a first drive strength), and the signal SIGNAL_P is a p-channel pullup signal having a p-ch drive strength (e.g., a second drive strength), less than the n-ch drive strength. In certain embodiments, for example, the p-ch drive strength can about ten times greater or about twenty times greater than the n-ch drive strength. In other embodiments, the signals generated by the detection circuits $DC_2$-$DC_4$ be other suitable signals generated by different signal sources and having different relative drive strengths. Although the first semiconductor die 102a is referred to as the master in the embodiment of FIG. 2, in other embodiments, any one of the semiconductor dies 102 can be configured as the master. In yet other embodiments, the semiconductor dies 102 can have arrangements other than master-slave.

As described in greater detail below with reference to FIGS. 3 and 4, the signals SIGNAL_$N_1$-$N_3$ and the signal SIGNAL_P can be selectively toggled on and off as part of a connectivity test to determine a resistance of and therefore connectivity of the test interconnect 110b. For example, the signals SIGNAL_$N_1$-$N_3$ can be individually toggled on (e.g., pull-down can be enabled on the semiconductor dies 102b-d) at the same time as the signal SIGNAL_P is toggled on (e.g., pull-up enabled on the first semiconductor die 102a). In general, the signal SIGNAL_OUT will vary depending on the resistance of the test interconnect 110b between the first semiconductor die 102a and the enabled one of the semiconductor dies 102b-d. For example, if the test interconnect 110b is highly resistive or electrically disconnected therebetween, the SIGNAL_OUT at the first semiconductor die 102a is dominated (e.g., substantially determined) by the smaller drive strength of the signal SIGNAL_P from the master semiconductor die 102a. Contrariwise, if the test interconnect 110b is well connected therebetween, the signal SIGNAL_OUT at the first semiconductor die 102a is dominated by the greater drive strength of the signals SIGNAL_$N_1$-$N_3$ from the toggled one of the semiconductor dies 102b-d.

The detection circuit $DC_1$ of the master semiconductor die 102a can be configured to compare the signal SIGNAL_OUT to a threshold magnitude, and the comparison can drive the logic signal LOGIC_OUT high or low. For example, if the test interconnect 110b is highly resistive or electrically disconnected (e.g., the signal SIGNAL_OUT is dominated by the signal SIGNAL_P such that the SIGNAL_OUT is below the threshold magnitude), then the logic signal LOGIC_OUT can have a first state (e.g., a high state). If the test interconnect 110b is electrically connected (e.g., the signal SIGNAL_OUT is dominated by the toggled one of the signals SIGNAL_$N_1$-$N_3$ such that the signal SIGNAL_OUT is above the threshold magnitude), then the logic signal LOGIC_OUT can have a second state (e.g., a high state). In this manner, the logic signal LOGIC_OUT can provide an indication of the connectivity of the test interconnect 110b between the first semiconductor die 102a and the toggled one of the semiconductor dies 102b-d.

Figure 3:
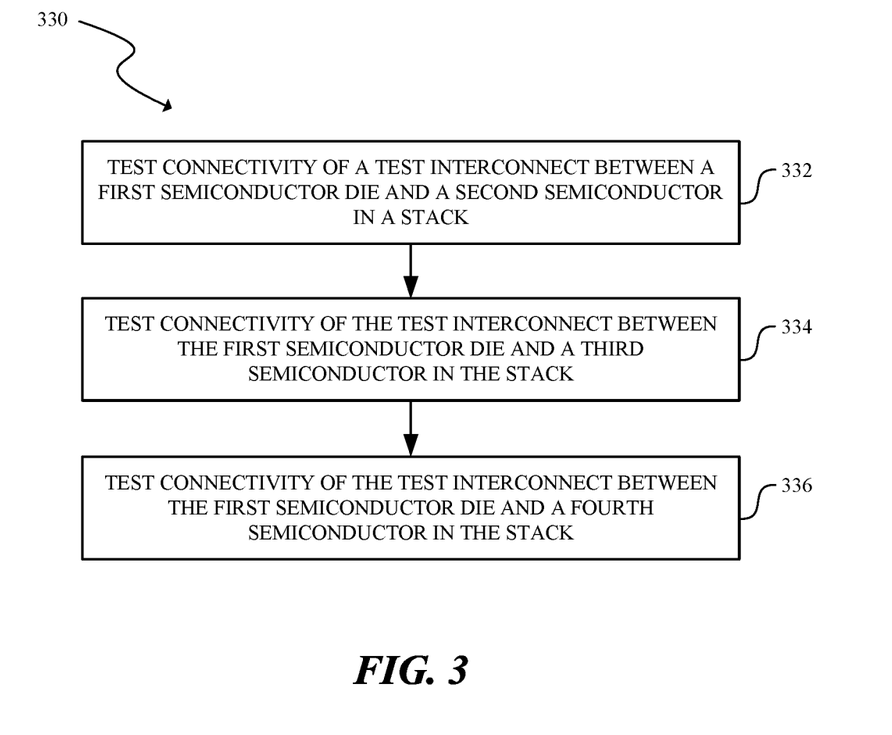
FIG. 3 is a flow diagram of a process or method for determining the connectivity of a test interconnect within a semiconductor device configured in accordance with an embodiment of the present technology.

More specifically, FIG. 3 is a flow diagram of a process or method 330 for determining the connectivity of a test interconnect within a semiconductor device configured in accordance with an embodiment of the present technology. For the sake of illustration, some features of the method 330 are described in the context of the embodiment shown in FIG. 2. FIG. 4 is a table illustrating the toggling of the signals SIGNAL_$N_1$-$N_3$ and the signal SIGNAL_P, and the resulting logic states of the logic signal LOGIC_OUT for each stage of the method 330 in the context of the embodiment shown in FIG. 2.

Referring to FIG. 3, beginning at block 332, the method 330 includes testing the connectivity of the test interconnect 110b between the first semiconductor die 102a and the second semiconductor die 102b. For example, as illustrated in FIG. 4, both the signal SIGNAL_P and the signal SIGNAL_$N_1$ can be toggled on, while the signals SIGNAL_$N_1$, $N_2$ are toggled off. Because the test interconnect 110b is electrically connected between the semiconductor dies 102a, b, the signal SIGNAL_OUT at the first semiconductor die 102a is dominated by the greater drive strength of the signal SIGNAL_$N_1$, which drives the logic signal LOGIC_OUT to the low state.

At block 334, the method 330 includes testing the connectivity of the test interconnect 110b between the first semiconductor die 102a and the third semiconductor die 102c. For example, as illustrated in FIG. 4, both the signal SIGNAL_P and the signal SIGNAL_$N_2$ can be toggled on, while the signals SIGNAL_$N_1$, $N_3$ are toggled off. Because the test interconnect 110b is electrically connected between the semiconductor dies 102a, c, the signal SIGNAL_OUT at the first semiconductor die 102a is dominated by the greater drive strength of the signal SIGNAL_$N_2$, which drives the logic signal LOGIC_OUT to the low state.

At block 336, the method 330 includes testing the connectivity of the test interconnect 110b between the first semiconductor die 102a and the fourth semiconductor die 102d. For example, as illustrated in FIG. 4, both the signal SIGNAL_P and the signal SIGNAL_$N_3$ can be toggled on, while the signals SIGNAL_$N_1$, $N_2$ are toggled off. Because the test interconnect 110b is electrically disconnected between the semiconductor dies 102a, d, the signal SIGNAL_OUT at the first semiconductor die 102a is dominated by the smaller drive strength of the signal SIGNAL_P, which drives the logic signal LOGIC_OUT to the high state.

The logic signal LOGIC_OUT can be read out of the device 100 to provide an indication of the connectivity of the test interconnect 110b. Based on the logic signal LOGIC_OUT having a high state (block 336), it can be determined that the test interconnect 110b is not well connected. In some embodiments, by testing the connectivity between each pair of semiconductor dies 102 in the stack 105, the specific position of the connectivity defect can be determined. For example, because the logic signal LOGIC_OUT is in the low state for each of the tests between the semiconductor dies 102a-c (blocks 332 and 334), it can be determined that the test interconnect 110b is disconnected between the semiconductor dies 102c, d. In other embodiments, the method 330 need not include testing the electrical connectivity between each pair of semiconductor dies 102 in the stack 105. For example, the method 330 can include testing only the connectivity between the uppermost and lowermost semiconductor dies 102 in the stack 105 (block 336), or another single pair of semiconductor dies 102 in the stack 105. Alternatively, the method 330 could terminate after a connectivity issue is detected between any pair of semiconductor dies 102 in the stack 105.

In some embodiments, instead of or in addition to reading out the logic signal LOGIC_OUT, the signal SIGNAL_OUT can be read out of the device 100 to, for example, provide information about a degree to which the test interconnect 110b is connected. For example, the voltage level of the signal SIGNAL_OUT can indicate whether the test interconnect 110b is completely disconnected, or only partially disconnected but highly resistive. In still other embodiments, the strength of one or more of the signals SIGNAL_N$_1$-N$_3$ and the signal SIGNAL_P can be varied to enable more detailed or specific testing and determination of the resistance of the test interconnect 110b. In particular, the ratio of the n-ch and p-ch drive strengths can be changed by changing the total drive of the transistors by adding more transistor width.

Figure 4:
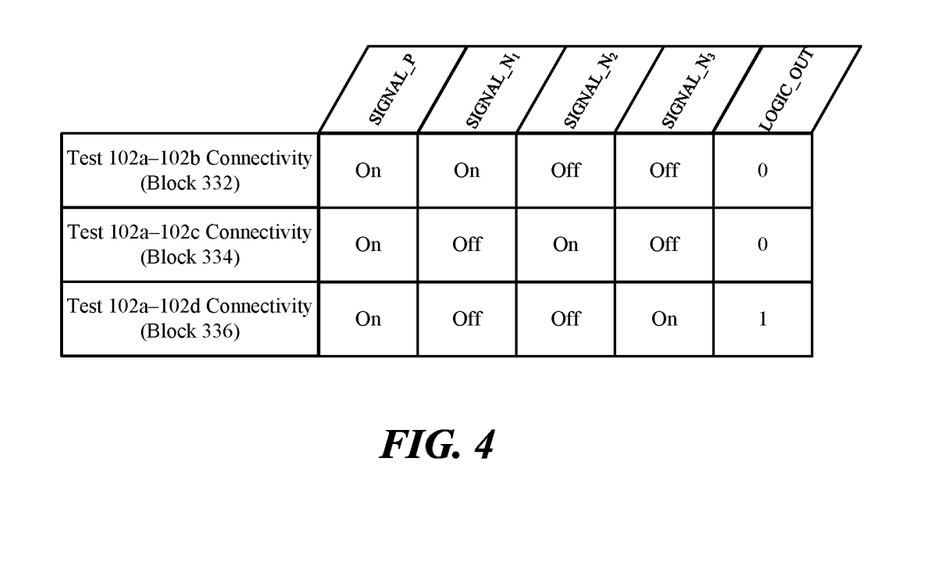
FIG. 4 is a table of logic states corresponding to the connectivity of the test interconnect of FIG. 2 as determined by the method of FIG. 3, in accordance with an embodiment of the present technology.

The device 100 can be configured for performing a connectivity test of the test interconnect 110c (FIG. 1) in a substantially similar or the same manner as the test interconnect 110b, as described in detail above with reference to FIGS. 2-4.

Figure 5:
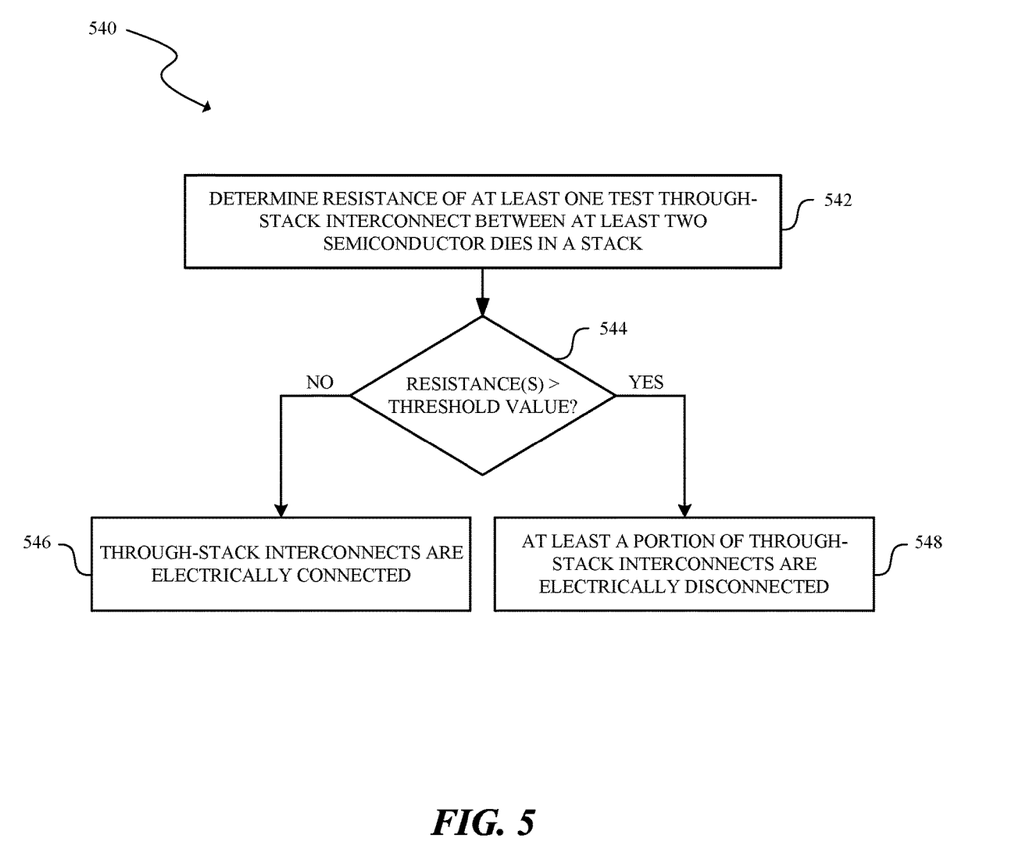
FIG. 5 is a flow diagram of a process or method for determining the connectivity of through-stack interconnects of a semiconductor device configured in accordance with an embodiment of the present technology.

FIG. 5 is a flow diagram of a process or method 540 for determining the connectivity of the first interconnects 110a of the device 100 (FIG. 1) configured in accordance with an embodiment of the present technology. Beginning at block 542, the method 540 includes determining the resistance of at least one test through-stack interconnect between at least two semiconductor dies 102 in the stack 105. For example, as set forth in detail above with reference to FIG. 3, the method 330 can be employed to read out a logic signal (e.g., the signal LOGIC_OUT) indicative of the resistance of the test interconnects 110b, c between one or more pairs of the semiconductor dies 102 in the stack 105. In some embodiments, the method 540 can include determining the resistance of both of the test interconnects 110b, c. In other embodiments, the method 540 can include determining the resistance of only one of the test interconnects 110b, c, and/or determining the resistance of additional test interconnects (not pictured) of the device 100 that are also formed in at-risk portions of the stack 105.

At block 544, the method 540 includes comparing the resistances of the test interconnects 110b, c to a threshold value. For example, as set forth in detail above with reference to FIG. 3, comparing the resistances to the threshold value can include determining or reading the state (e.g., high or low) of the logic signal output from the device 100. In other embodiments, comparing the resistances to the threshold value can include directly comparing the resistances (e.g., the magnitude of the signal SIGNAL_OUT) to the threshold value.

The method 540 branches depending on the result of the comparison at block 544. In some embodiments, if the resistances of the test interconnects 110b, c are each below the threshold value, the method 540 proceeds to block 546 where a determination is made that the first interconnects 110a are electrically connected, or at least that substantially all of the first interconnects 110a are electrically connected. In particular, because the test interconnects 110b, c are formed in a more at-risk portion of the stack 105, if the test interconnects 110b, c are each electrically connected, the first interconnects 110a—positioned in a less defect prone portion of the stack 105—are also likely electrically connected. In the embodiment illustrated in FIG. 1, the soundness of the determination is bolstered because the test interconnects 110b, c are positioned proximate the opposing edges 107a, b of the stack 105. Thus, the electrical connectivity of both test interconnects 110b, c can indicate that the device 100 is relatively planar between the opposing edges 107a, 107b. In some embodiments, where the resistance of multiple test interconnects is determined, the method 540 can proceed to block 546 even if one or more of the multiple test interconnects are determined to be highly resistive.

In some embodiments, if at least one of the resistances of the test interconnects 110b, c is above the threshold value, the method 540 proceeds to block 548 where a determination is made that at least a portion of the first interconnects 110a are electrically disconnected. In particular, if at least one of the test interconnects 110b, c is electrically disconnected, it is more likely that at least one of the first interconnects 110a is also electrically disconnected. Disconnected or highly resistive ones of the first interconnects 110a can render the device 100 inoperable. In some embodiments, where the resistance of multiple test interconnects is determined, the method 540 can proceed to block 548 only if two or more of the multiple test interconnects (e.g., those on opposing sides of the device 100) are determined to be highly resistive.

Accordingly, the present technology advantageously allows for robust connectivity testing of the first interconnects 110a of the device 100 without requiring that the connectivity of each individual first interconnect 110a be tested—which can be costly and time-consuming. Rather, the present technology monitors the connectivity of only a limited number of at-risk test interconnects 110b, c, thereby reducing the time needed to test and verify that the first interconnects 110a are connected. In addition, the present technology reduces or eliminates the need for complex circuitry and test methods otherwise necessary to test each individual first interconnect 110a. Moreover, the test interconnects 110b, c can be formed in at-risk portions of the device 100 that would not otherwise include the functional first interconnects 110a. As such, the test interconnects 110b, c do not occupy an area that would otherwise be used for functional features and can be included in the device 100 without increasing the size of the device 100 and/or decreasing the signal density in the device 100.

Figure 6:
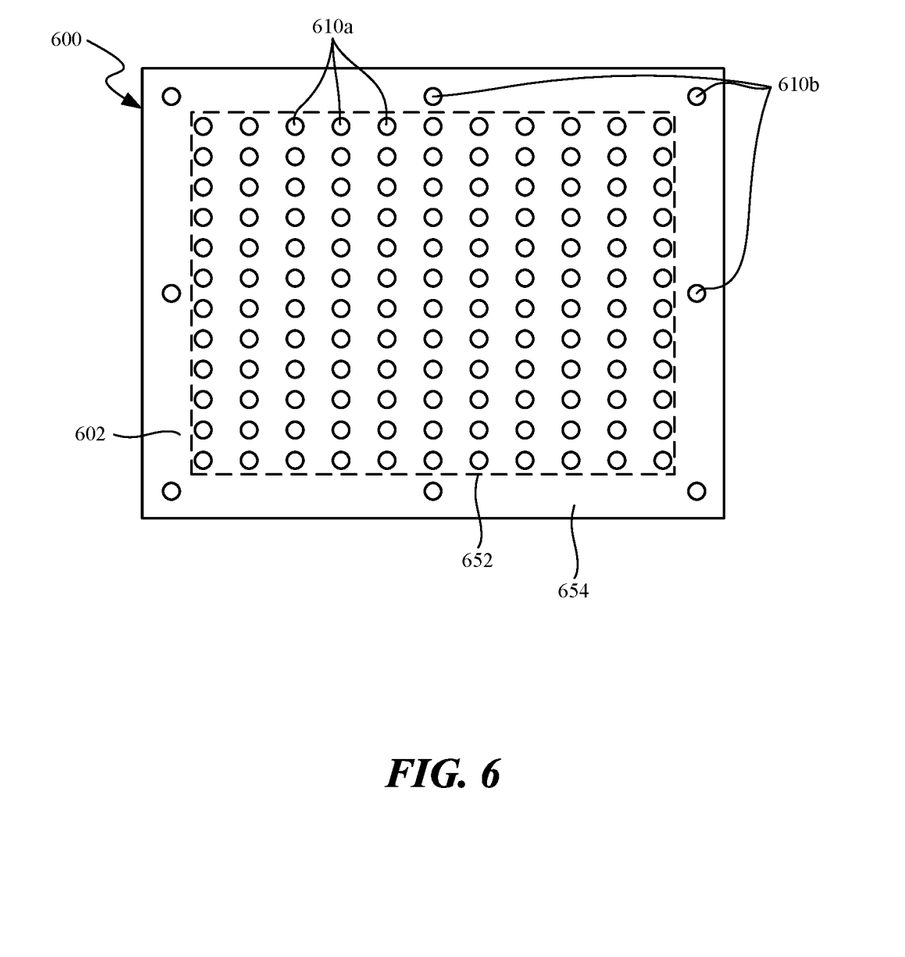
FIG. 6 is a top view of a semiconductor device in accordance with an embodiment of the present technology.

While many of the embodiments described above include two test interconnects positioned proximate opposing edges of a semiconductor device, one skilled in the art will understand that the semiconductor devices of the present technology can include any number of test interconnects having any suitable positioning. In some embodiments, the number and positioning of test interconnects can be based on the specific layout of the functional interconnects within a semiconductor device. For example, FIG. 6 is a schematic top view of a semiconductor device 600 configured in accordance with an embodiment of the present technology. The semiconductor device 600 can include features generally similar to the features of the semiconductor device 100 described in detail above. For example, the semiconductor device 600 includes a plurality semiconductor dies 602 (only an uppermost semiconductor die 602 is visible in FIG. 6) arranged in a stack, and through-stack interconnects 610 (shown schematically) extending through the stack to electrically couple the semiconductor dies 602. The through-stack interconnects can include functional interconnects 610a and test interconnects 610b.

In the illustrated embodiment, the semiconductor dies 602 are generally rectilinear and the stack of semiconductor dies 602 includes a central portion 652 and a peripheral portion 654. The functional through-stack interconnects 610a extend through the central portion 652, while the test interconnects 610b extend through the peripheral portion 654. As described in detail above, the test interconnects 610b can be more prone to connectivity defects because, for example, the peripheral portion 654 is more likely to be damaged (e.g., warped) by a bonding operation used to form the through-stack interconnects 610. The test interconnects 610b are generally evenly spaced in the peripheral portion 654 around the functional interconnects 610a. Accordingly, connectivity testing of the test interconnects 610b can provide a robust determination of the connectivity of the functional through-stack interconnects 610a—which are generally evenly positioned throughout the central portion 652 of the stack. For example, a determination that each of the test interconnects 610b is connected can provide a strong indication that the semiconductor device 600 is relatively planar, and thus that functional interconnects 610a are likely electrically connected.

Figure 7:
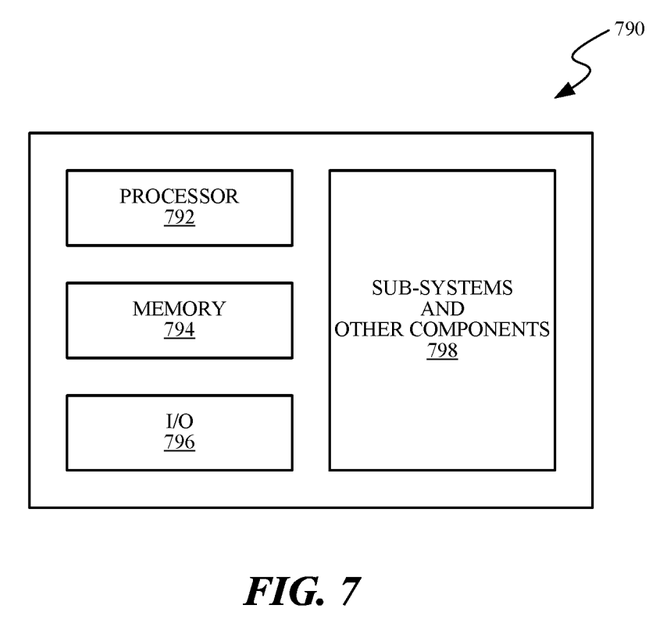
FIG. 7 is a schematic view of a system that includes a semiconductor device configured in accordance with embodiments of the present technology.

Any one of the semiconductor devices having the features described above (e.g., with reference to FIGS. 1-6) can be incorporated into any of a myriad of larger and/or more complex systems, a representative example of which is system 790 shown schematically in FIG. 7. The system 790 can include a processor 792, a memory 794 (e.g., SRAM, DRAM, flash, and/or other memory devices), input/output (I/O) devices 796, and/or other subsystems or components 798. The semiconductor dies and semiconductor die assemblies described above can be included in any of the elements shown in FIG. 5. The resulting system 790 can be configured to perform any of a wide variety of suitable computing, processing, storage, sensing, imaging, and/or other functions. Accordingly, representative examples of the system 790 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 790 include lights, cameras, vehicles, etc. With regard to these and other example, the system 790 can be housed in a single unit or distributed over multiple interconnected units, e.g., through a communication network. The components of the system 790 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps or stages are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a stack of semiconductor dies including a first semiconductor die and a second semiconductor die stacked over the first semiconductor die, wherein the first semiconductor die includes a first detection circuit, and wherein the second semiconductor die includes a second detection circuit;
   through-stack interconnects extending between the first semiconductor die and the second semiconductor die, the through-stack interconnects including—
     a plurality of first through-stack interconnects, wherein the plurality of first through-stack interconnects are not connected to the first detection circuit or the second detection circuit;
     a second through-stack interconnect positioned nearer to a first edge of the stack than any of the plurality of first through-stack interconnects, wherein the second through-stack interconnect is connected to both the first detection circuit and the second detection circuit; and a third through-stack interconnect positioned nearer to a second edge of the stack than any of the plurality of first through-stack interconnects, wherein the third through-stack interconnect is connected to both the first detection circuit and the second detection circuit; and wherein the first semiconductor die is configured to—
output a first output signal indicative of a connectivity of the second through-stack interconnect; and
output a second output signal indicative of a connectivity of the third through-stack interconnect.

2. The semiconductor device of claim 1 wherein the first detection circuit includes a first signal source configured to output a first test signal to both the second through-stack interconnect and the third through-stack interconnect, and wherein the second detection circuit includes a second signal source configured to output a second test signal to both the second through-stack interconnect and the third through-stack interconnect.

3. The semiconductor device of claim 2, wherein the first test signal has a drive strength that is smaller than a drive strength of the second test signal.

4. The semiconductor device of claim 3, wherein the drive strength of the second test signal is at least ten times greater than the drive strength of the first test signal.

5. The semiconductor device of claim 2, wherein the first test signal is a p-channel pullup signal, and wherein the second test signal is an n-channel pulldown signal.

6. The semiconductor device of claim 1, wherein the first semiconductor die and the second semiconductor dies have identical components, and wherein the first semiconductor die is configured as a master and the second semiconductor die is configured as a slave.

7. The semiconductor device of claim 1, wherein the second through-stack interconnect is positioned within 200 µm of the first edge, and the third through-stack interconnect is positioned within 200 µm of the second edge.

8. The semiconductor device of claim 1, wherein—
when the second through-stack interconnect is at least partially electrically disconnected, the first output signal has a first logic state;
when the second through-stack interconnect is electrically connected, the first output signal has a second logic state;
when the third through-stack interconnect is at least partially electrically disconnected, the second output signal has the first logic state; and
when the third through-stack interconnect is electrically connected, the second output signal has the second logic state.

9. A semiconductor device, comprising:
a plurality of semiconductor dies arranged in a stack;
a first through-stack interconnect extending through a first portion of the stack;
a plurality of second through-stack interconnects extending through a second portion of the stack, wherein the second portion of the stack is less prone to connectivity defects than the first portion of the stack; and
a circuitry configured to—
provide a first signal having a first drive strength to the first through-stack interconnect from a first semiconductor die in the stack, wherein the first signal is a p-channel pullup signal;
provide a second signal having a second drive strength to the first through-stack interconnect from a second semiconductor die in the stack, wherein the second signal is an n-channel pulldown signal having a drive strength greater than a drive strength of the p-channel pullup signal;
receive a signal indicative of a resultant voltage of the first through-stack interconnect; and
output an output signal, wherein the output signal has a first logic state when the signal indicative of the resultant voltage has a first state, and wherein the output signal has a second logic state when the signal indicative of the resultant voltage has a second state.

10. The semiconductor device of claim 9, wherein the first logic state indicates that all of the plurality of second through-stack interconnects are electrically connected, and wherein the second logic state indicates that at least one of the plurality of second through-stack interconnects is electrically disconnected.

11. The semiconductor device of claim 9, wherein the circuitry is further configured to determine the resultant voltage at the first semiconductor die.

12. The semiconductor device of claim 9, wherein the first portion of the stack is laterally outboard of the second portion of the stack.

13. The semiconductor device of claim 9, wherein the drive strength of the p-channel pullup signal is variable.

14. The semiconductor device of claim 9, wherein the circuitry is further configured such that—
when a resistance of the first through-stack interconnect is below a threshold magnitude, the signal indicative of the resultant voltage has the first state; and
when the resistance of the first through-stack interconnect is above a threshold magnitude, the signal indicative of the resultant voltage has the second state.

15. A semiconductor device, comprising:
a plurality of semiconductor dies arranged in a stack;
a first through-stack interconnect extending through a first portion of the stack;
a second through-stack interconnect extending through a second portion of the stack;
a plurality of third through-stack interconnects extending through a third portion of the stack; and
a circuitry configured to—
determine resistances of the first through-stack interconnect between a first semiconductor die of the stack and each other semiconductor die in the stack;
determine resistances of the second through-stack interconnect between the first semiconductor die and each other semiconductor die in the stack;
when each of the determined resistances of the first through-stack interconnect and the determined resistances of the second through-stack interconnect is above a threshold magnitude, output a signal having a first logic state indicating that all of the third through-stack interconnects are electrically connected; and
when at least one of the determined resistances of the first through-stack interconnect or the determined resistances of the second through-stack interconnect is below the threshold magnitude, output the signal having a second logic state indicating that at least a portion of the third through-stack interconnects are electrically disconnected.

16. The semiconductor device of claim 15, wherein the first portion and the second portion of the stack are more prone to connectivity defects than the third portion of the stack.

17. The semiconductor device of claim 15, wherein the first portion and the second portion of the stack are more prone to warpage than the third portion of the stack.

18. The semiconductor device of claim 15, wherein the first portion of the stack is a first edge portion of the stack, wherein the second portion of the stack of semiconductor dies is a second edge portion of the stack, and wherein the third portion of the stack is laterally inboard of the first portion and the second portion of the stack.

* * * * *